United States Patent
Xie et al.

(10) Patent No.: US 12,400,054 B2
(45) Date of Patent: Aug. 26, 2025

(54) METHOD FOR BUILDING FINITE ELEMENT MODEL OF CORNEAL ENDOTHELIAL CELLS

(71) Applicant: Shandong First Medical University Affiliated Eye Institute (SHANDONG EYE INSTITUTE/QINGDAO EYE HOSPITAL OF SHANDONG FIRST MEDICAL UNIVERSITY), Qingdao (CN)

(72) Inventors: Lixin Xie, Qingdao (CN); Dongfang Li, Qingdao (CN); Zongyi Li, Qingdao (CN); Qingjun Zhou, Qingdao (CN); Ping Lin, Qingdao (CN); Xinhang Wang, Qingdao (CN); Chaoying Wang, Qingdao (CN)

(73) Assignee: Shandong First Medical University Affiliated Eye Institute (SHANDONG EYE INSTITUTE/QINGDAO EYE HOSPITAL OF SHANDONG FIRST MEDICAL UNIVERSITY), Qingdao (CN)

( * ) Notice: Subject to any disclaimer, the term of this patent is extended or adjusted under 35 U.S.C. 154(b) by 0 days.

(21) Appl. No.: 18/871,462

(22) PCT Filed: Nov. 5, 2024

(86) PCT No.: PCT/CN2024/129879
§ 371 (c)(1),
(2) Date: Dec. 3, 2024

(87) PCT Pub. No.: WO2025/093044
PCT Pub. Date: May 8, 2025

(65) Prior Publication Data
US 2025/0165669 A1   May 22, 2025

(30) Foreign Application Priority Data

Nov. 1, 2023   (CN) .......................... 202311441515.0

(51) Int. Cl.
*G06F 30/20* (2020.01)
(52) U.S. Cl.
CPC .................................. *G06F 30/20* (2020.01)
(58) Field of Classification Search
CPC ......................................................... G06F 30/20
See application file for complete search history.

(56) References Cited

U.S. PATENT DOCUMENTS

| 2009/0187386 A1 | 7/2009 | Bille et al. |
| 2018/0000339 A1* | 1/2018 | Hipsley ............ G06F 17/18 |
| 2018/0125582 A1 | 5/2018 | Shih et al. |

FOREIGN PATENT DOCUMENTS

| CN | 113171172 A | 7/2021 |
| CN | 114927222 A | 8/2022 |
| JP | H09313442 A | 12/1997 |

OTHER PUBLICATIONS

Khan SN, Shiakolas PS. Finite element analysis of Descemet's stripping automated endothelial keratoplasty (DSAEK) surgery allograft to predict endothelial cell loss. Current Eye Research. Jan. 2, 2017;42(1):32-40. (Year: 2017).*

(Continued)

*Primary Examiner* — Chuen-Meei Gan
(74) *Attorney, Agent, or Firm* — Hawaii Patent Services; Nathaniel K. Fedde; Kenton N. Fedde (57) ABSTRACT

The present disclosure provides a method for building a finite element model of corneal endothelial cells, including: importing a standard corneal model into finite element pre-processing software, and generating 2D meshes, to obtain a basic mesh model; importing a detailed geometric model of corneal endothelial cells; determining a complete (Continued)

corneal endothelial cell model according to the basic mesh model and the detailed geometric model; and performing calculation according to the complete corneal endothelial cell model. The present disclosure can improve the efficiency and effect of building a finite element model of corneal endothelial cells.

3 Claims, 9 Drawing Sheets

(56) References Cited

OTHER PUBLICATIONS

Zhao Y, Hu G, Yan Y, Wang Z, Liu X, Shi H. Biomechanical analysis of ocular diseases and its in vitro study methods. BioMedical Engineering OnLine. Jul. 23, 2022;21(1):49. (Year: 2022).*
Like Sun, Construction of Cornea Sclera Constitutive Equation and Smile Operation Finite Element Analysis. China Master's Theses Full-text Database Basic Sciences, issue 3. pp. A002-A504.
Salman N. Khan etal, Finite Element Analysis of Descent's Stripping Automated Endothelial Keratoplasty (DSAEK) Surgery allograft to Predict Endothelial Cell Loss. Current Eye Research. Jun. 1, 2016. pp. 3-9.

* cited by examiner

Detailed modeling part of cells

FIG. 17

METHOD FOR BUILDING FINITE ELEMENT MODEL OF CORNEAL ENDOTHELIAL CELLS

TECHNICAL FIELD

The present disclosure relates to the field of model design, and in particular to a method for building a finite element model of corneal endothelial cells.

BACKGROUND

Corneal endothelial cells are the innermost cells of the cornea and are single-layer hexagonal cells, which play an important role in maintaining corneal transparency and normal visual function. The density of corneal endothelial cells decreases slowly at a rate of 0.3% to 0.6% per year. In the event of trauma, intraocular surgery, etc., the loss of endothelial cells will be even greater. Damaged endothelial cells are repaired by expanding migration. If there is excessive loss of corneal endothelial cells, decompensation of endothelial metabolic pump function may cause corneal edema, fracture or missing of tight junctions between cells, partial cell boundary missing and fusion, and barrier function decrease, which is clinically manifested as decompensation of corneal endothelial function. In the diagnosis and treatment of corneal diseases, the morphology and number of corneal endothelial cells are often important reference indicators.

Currently, a large number of studies focus on corneal endothelial cell density, cell area coefficient of variation and hexagonal cell proportion. However, clinically, it has been found that there are a large number of phenomena in which the cell density is high, but the cornea is obviously edema or the cell density is low, but the cornea is still transparent, indicating that the current method for morphology examination of corneal endothelial cells cannot accurately reflect cell function.

SUMMARY

In order to overcome the defects of the existing technology, an objective of the present disclosure is to provide a method for building a finite element model of corneal endothelial cells.

In order to achieve the above objective, the present disclosure provides the following solution:

A method for building a finite element model of corneal endothelial cells includes:
importing a standard corneal model into finite element pre-processing software, and generating 2D meshes, to obtain a basic mesh model;
importing a detailed geometric model of corneal endothelial cells;
determining a complete corneal endothelial cell model according to the basic mesh model and the detailed geometric model; and
performing calculation according to the complete corneal endothelial cell model.

Preferably, the generating 2D meshes includes:
selecting a corneal endothelial surface to generate 2D meshes, the minimum mesh size being 2 µm, the maximum mesh size being 368 µm, the size of an intermediate mesh of the model as a basic mesh model being 2 µm that gradually increases in a radial direction;
using a transition mesh division method to keep all elements as quadrilateral elements; and
deleting the intermediate mesh as a basic mesh, and leaving a 469 µm×324 µm space, to replace a detailed cell model.

Preferably, after importing the detailed geometric model of corneal endothelial cells, the method further includes:
generating a 2D mesh according to the detailed geometric model, the size of the mesh being 2 µm.

Preferably, the determining a complete corneal endothelial cell model according to the basic mesh model and the detailed geometric model includes: using beam elements to simulate connexin between cells;
projecting the mesh generated according to the detailed geometric model onto the corneal endothelial surface so that the detailed geometric model is fitted to the corneal endothelial surface;
connecting the basic mesh model with the detailed mesh model to form a complete corneal endothelial cell model; and
projecting all meshes onto the corneal endothelial surface so that the complete mesh model is fitted to the corneal endothelial cell surface.

Preferably, the performing calculation according to the complete corneal endothelial cell model includes:
assigning material and cross-sectional properties to the corneal endothelial cell model in finite element simulation software, selecting a Neo-Hooke model as a material constitutive model, setting a material parameter C10 to 173 Pa, setting a material parameter D1 to 0.0006 1/Pa, and defining a thickness of 5 µm for the endothelial cells;
connecting two cells by a beam element, and assigning a circular cross-section to the beam element, the radius of the circular cross-section being 1 µm;
constraining the outermost nodes of the corneal endothelial cells to the translational degrees of freedom in the X, Y and Z directions to fix the complete corneal endothelial cell model;
selecting the corneal endothelial cell model, and applying a pressure of 2E-07 MPa, to simulate an intraocular pressure; and
submitting the calculation in the finite element simulation software and obtaining a calculation result.

According to the specific embodiments provided by the present disclosure, the present disclosure discloses the following technical effects:

The present disclosure provides a method for building a finite element model of corneal endothelial cells, including: importing a standard corneal model into finite element pre-processing software, and generating 2D meshes, to obtain a basic mesh model; importing a detailed geometric model of corneal endothelial cells; determining a complete corneal endothelial cell model according to the basic mesh model and the detailed geometric model; and performing calculation according to the complete corneal endothelial cell model. The present disclosure can improve the efficiency and effect of building a finite element model of corneal endothelial cells.

BRIEF DESCRIPTION OF DRAWINGS

In order to explain the technical solutions in embodiments of the present disclosure or the in the existing technology more clearly, the drawings to be used in the embodiments will be briefly introduced below. Obviously, the drawings in the following description show merely some embodiments of the present disclosure, and those of ordinary skill in the art may still derive other drawings according to these drawings without creative efforts.

DETAILED DESCRIPTION OF EMBODIMENTS

The technical solutions in the embodiments of the present disclosure will be clearly and completely described below with reference to the drawings in the embodiments of the present disclosure. Obviously, the described embodiments are only some of the embodiments of the present disclosure, rather than all the embodiments. Based on the embodiments of the present disclosure, all other embodiments obtained by those of ordinary skill in the art without creative efforts fall within the scope of protection of the present disclosure.

In order to make the above objective, features and advantages of the present disclosure more obvious and understandable, the present disclosure will be described in further detail below with reference to the drawings and specific embodiments.

In this embodiment, the applicable case or disease ranges are not distinguished or limited, that is, diseases such as glaucoma, etc. involving endothelium are all applicable to the method involved in this embodiment.

Figure 1:
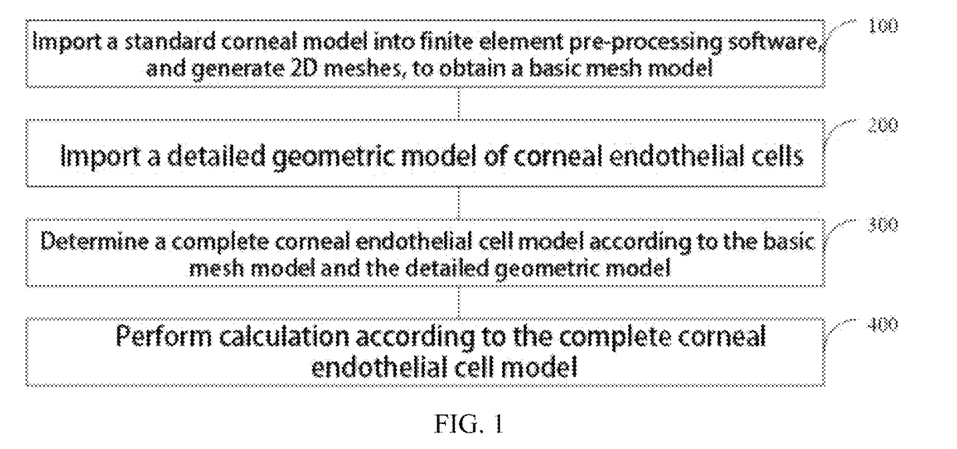
FIG. 1 is a flow chart of a method provided by an embodiment of the present disclosure.

FIG. 1 is a flow chart of a method provided by an embodiment of the present disclosure. As shown in FIG. 1, the present disclosure provides a method for building a finite element model of corneal endothelial cells, including:

Step 100: a standard corneal model is imported into finite element pre-processing software, and 2D meshes are generated, to obtain a basic mesh model;

Step 200: a detailed geometric model of corneal endothelial cells is imported;

Step 300: a complete corneal endothelial cell model is determined according to the basic mesh model and the detailed geometric model; and Step 400: calculation according to the complete corneal endothelial cell model is performed.

Figure 2:
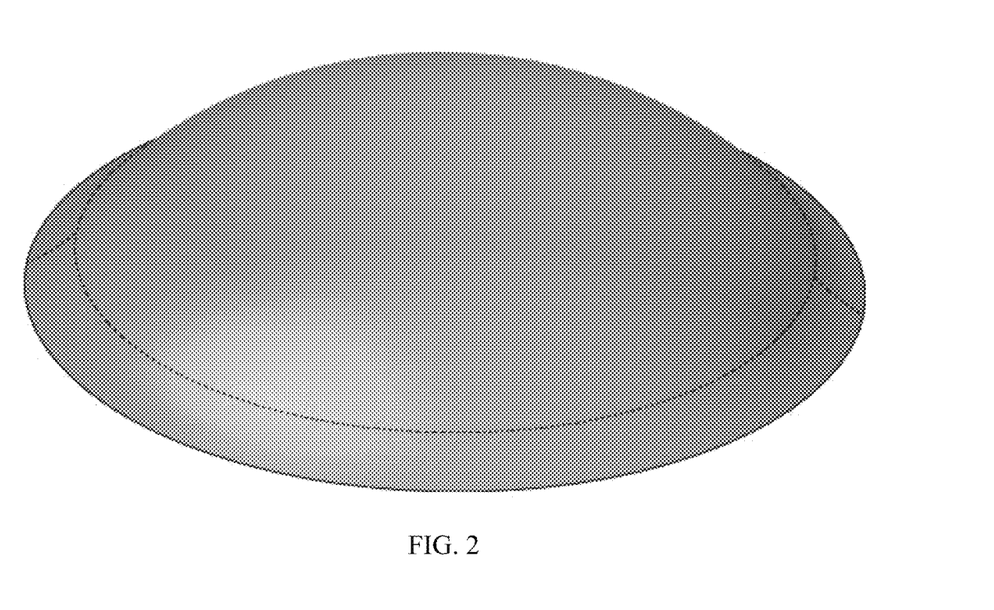
FIG. 2 is a schematic diagram of an inner surface of a standard corneal geometric model provided by an embodiment of the present disclosure.

Specifically, the cornea contains endothelium, connexin, descemet membrane, stroma, bowman membrane and epithelium. Taking into account factors such as checking method, calculation accuracy and calculation efficiency, there are various methods for building a finite element model of corneal endothelial cells, which have different manifestations in model level and area. The model in this embodiment includes corneal endothelium and connexin, and the area of the model is the same as that the complete endothelium. The specific implementation process is as follows:

1. A standard corneal model is imported into finite element pre-processing software Hypermesh, as shown in FIG. 2.

Figure 3:
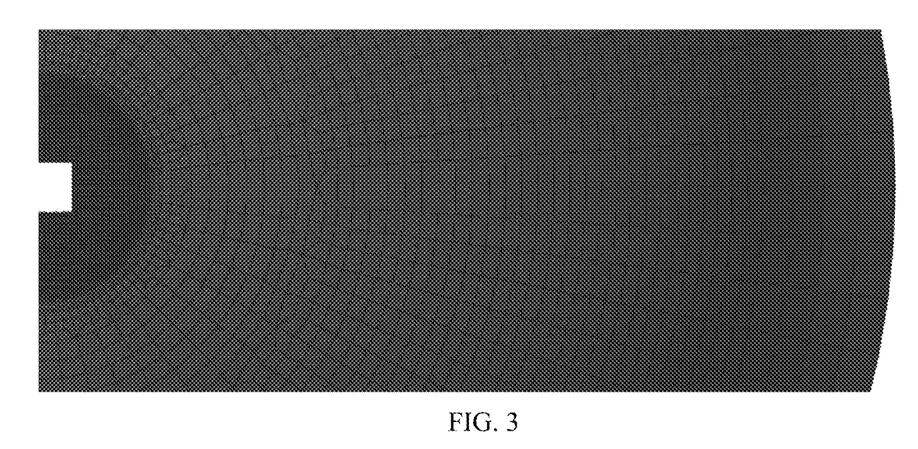
FIG. 3 is a schematic diagram of mesh size transition provided by an embodiment of the present disclosure.
Figure 4:
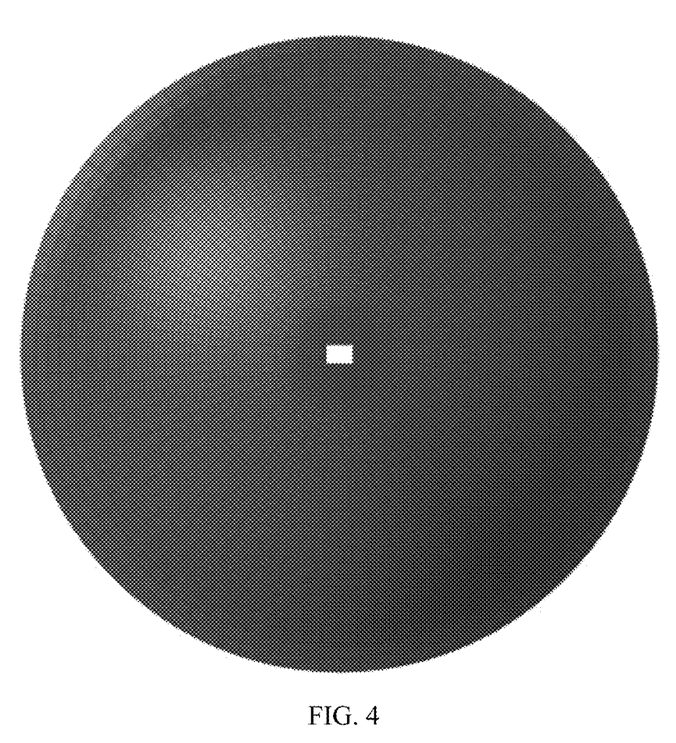
FIG. 4 is a schematic diagram of a basic mesh model provided by an embodiment of the present disclosure.

2. A corneal endothelial surface selected to generate 2D meshes, the minimum mesh size is 2 μm, the maximum mesh size is 368 μm, the size of an intermediate mesh of the model as a basic mesh model is 2 μm that gradually increases in a radial direction; a transition mesh division method is used to keep all elements as quadrilateral elements, as shown in FIG. 3; and the intermediate mesh as a basic mesh is deleted, and 469 μm×324 μm space is left, to replace a detailed cell model, as shown in FIG. 4.

Figure 5:
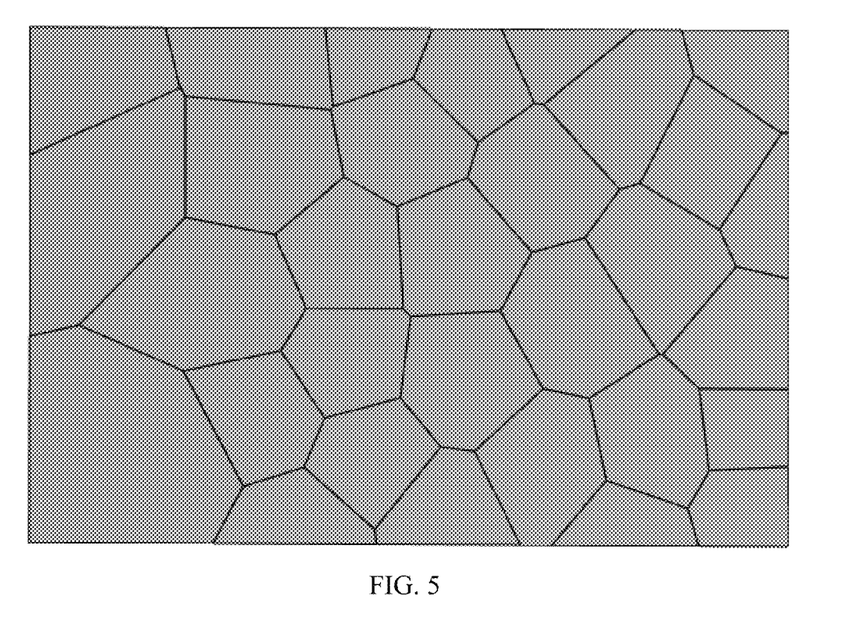
FIG. 5 is a schematic diagram of a detailed geometric model of corneal endothelial cells at compensation stage after PKP provided by an embodiment of the present disclosure.
Figure 6:
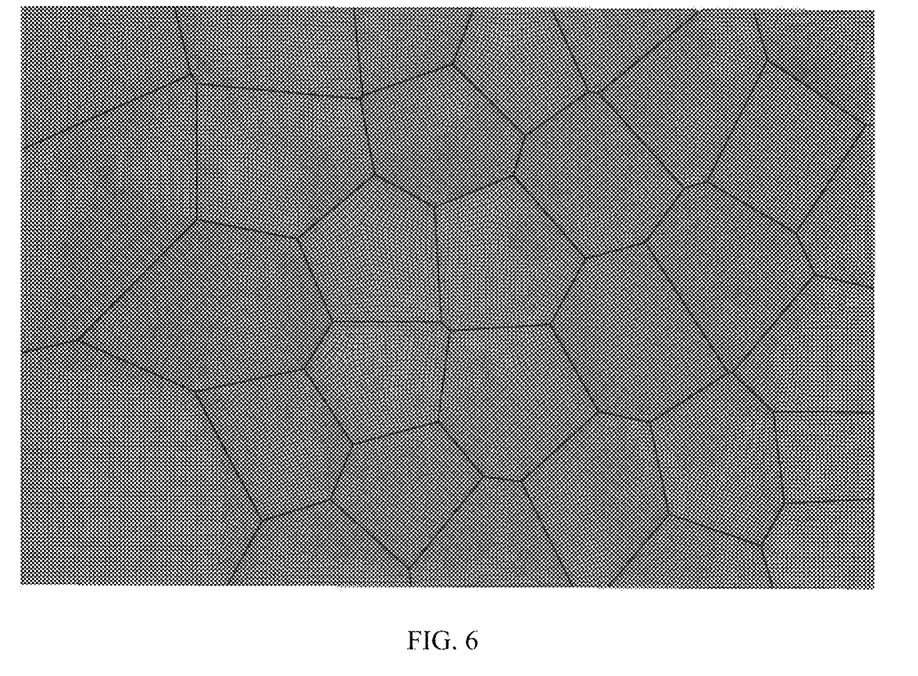
FIG. 6 is a schematic diagram of a detailed mesh model of corneal endothelial cells at decompensation stage after PKP provided by an embodiment of the present disclosure.

3. After the introduction of penetrating keratoplasty (PKP), hereafter referred to as PKP, see FIG. 5 for the detailed geometric model of corneal endothelial cells at compensation stage; and a 2D mesh is generated, the size of the mesh is 2 μm, as shown in FIG. 6.

4. Beam elements are used to simulate connexin between cells. See the black connection in FIG. 7 for beam elements.

Figure 8:
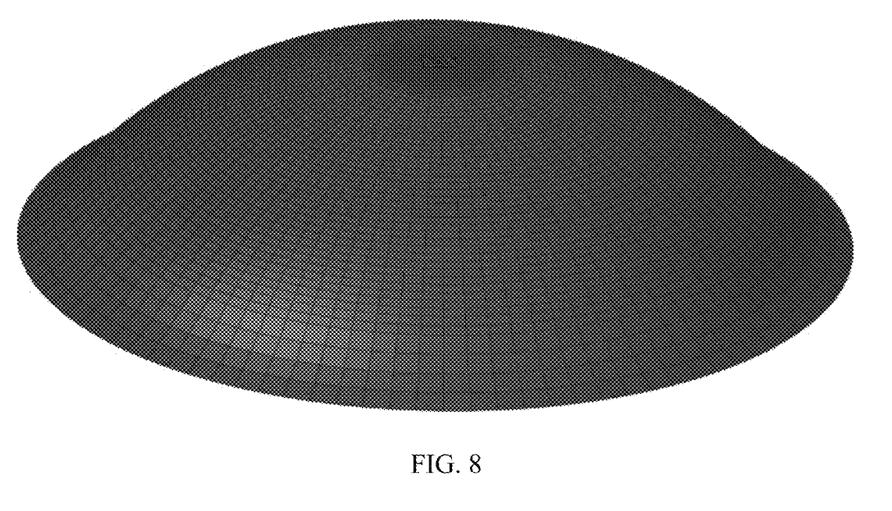
FIG. 8 is a schematic diagram of a complete corneal endothelial cell model provided by an embodiment of the present disclosure.

5. The mesh generated according to the detailed model is projected onto the corneal endothelial surface so that the detailed model is fitted to the corneal endothelial surface, as shown in FIG. 8.

Figure 7:
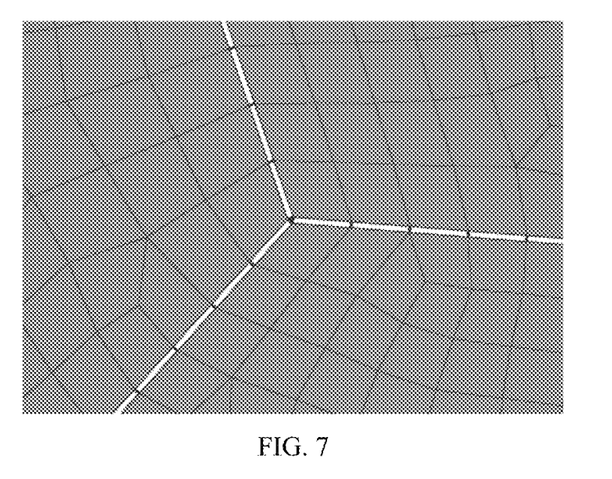
FIG. 7 is a schematic diagram of beam element connection provided by an embodiment of the present disclosure.
Figure 9:
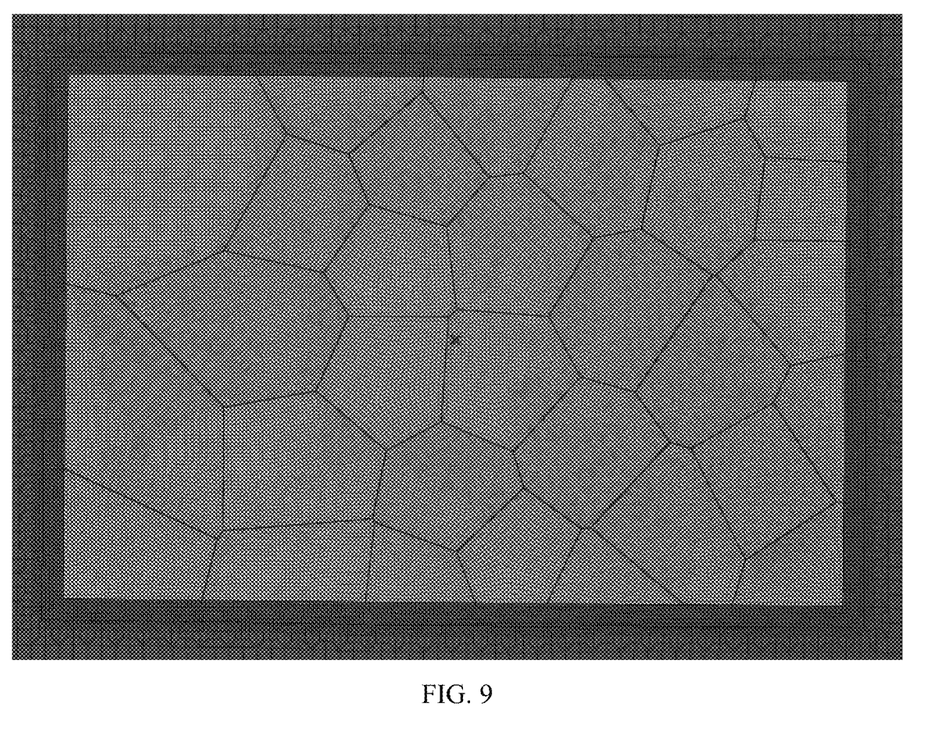
FIG. 9 is a schematic diagram of connection between a basic model and a detailed mesh model provided by an embodiment of the present disclosure.

6. The basic mesh model with the detailed mesh model is connected to form a complete corneal endothelial cell model, as shown in FIG. 7. See FIG. 9 for the connection between the basic model and the detailed mesh model.

7. All meshes onto the corneal endothelial surface are projected, so the complete mesh model is fitted to the corneal endothelial cell surface.

8. The complete corneal endothelial cell model is exported to an inp file.

9. The inp file is imported into simulation software Abaqus.

10. Material and cross-sectional properties are assigned to the endothelial cell mesh model in the Abaqus, a Neo-Hooke model is selected as a material constitutive model, a material parameter C10 to 173 Pa is set, a material parameter D1 to 0.00061/Pa is set, and a thickness of 5 μm for the endothelial cells is defined.

11. Two cells are connected by a beam element, and a circular cross-section is assigned to the beam element, the radius of the circular cross-section being 1 μm.

Figure 10:
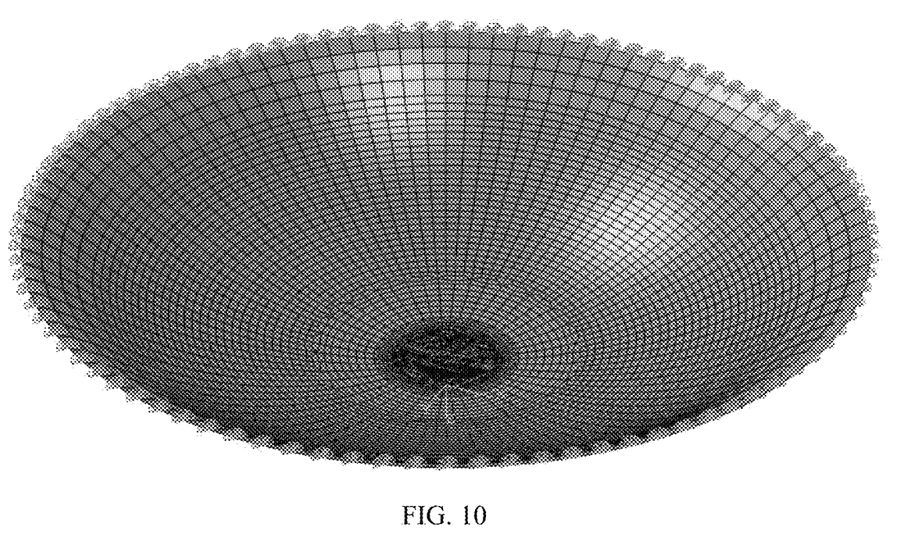
FIG. 10 is a schematic diagram of cornea constraint provided by an embodiment of the present disclosure.

12. The outermost nodes of the corneal endothelial cells are constrained to the translational degrees of freedom in the X, Y and Z directions, as shown in FIG. 10, to fix the complete corneal endothelial cell model.

Figure 11:
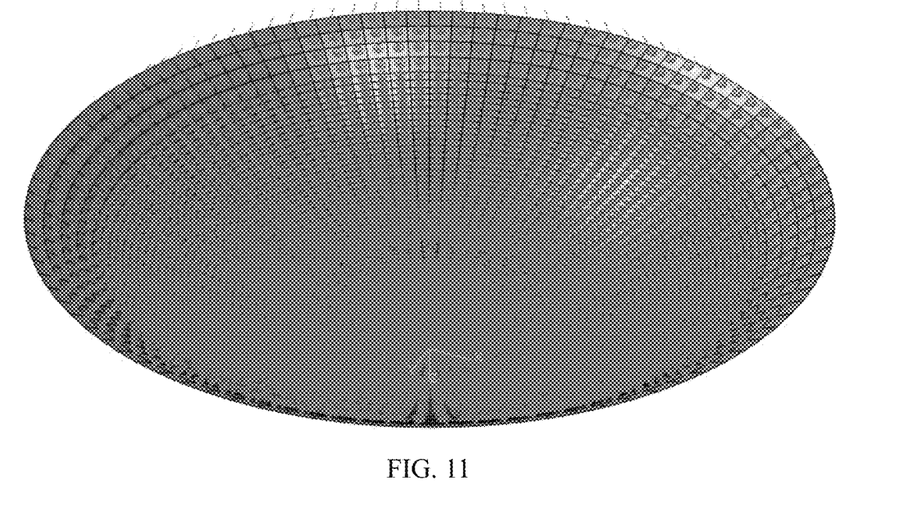
FIG. 11 is a schematic diagram of a pressure provided by an embodiment of the present disclosure.

13. The corneal endothelial cell model is selected, and a pressure of 2E-07 MPa is applied, as shown in FIG. 11, to simulate an intraocular pressure.

14. The calculation is submitted, and a result is viewed after the calculation is completed.

Figure 12:
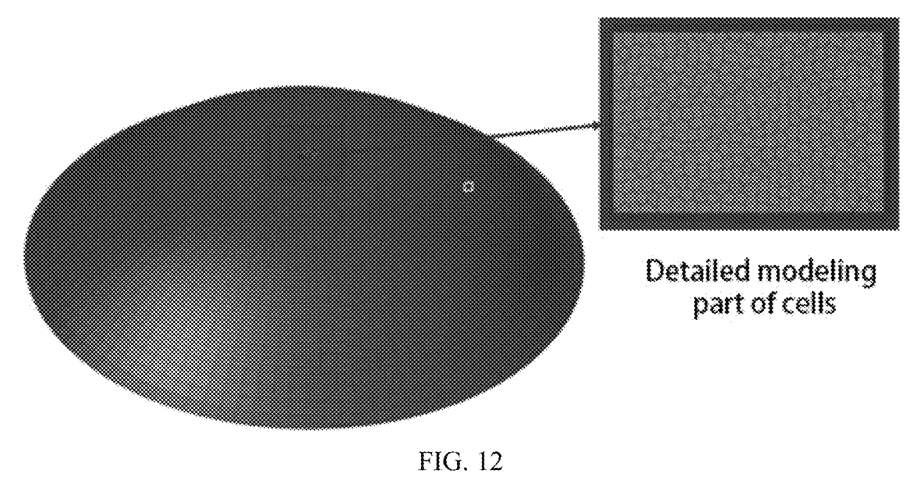
FIG. 12 is a schematic diagram of a normal corneal endothelial cell mesh model provided by an embodiment of the present disclosure.
Figure 13:
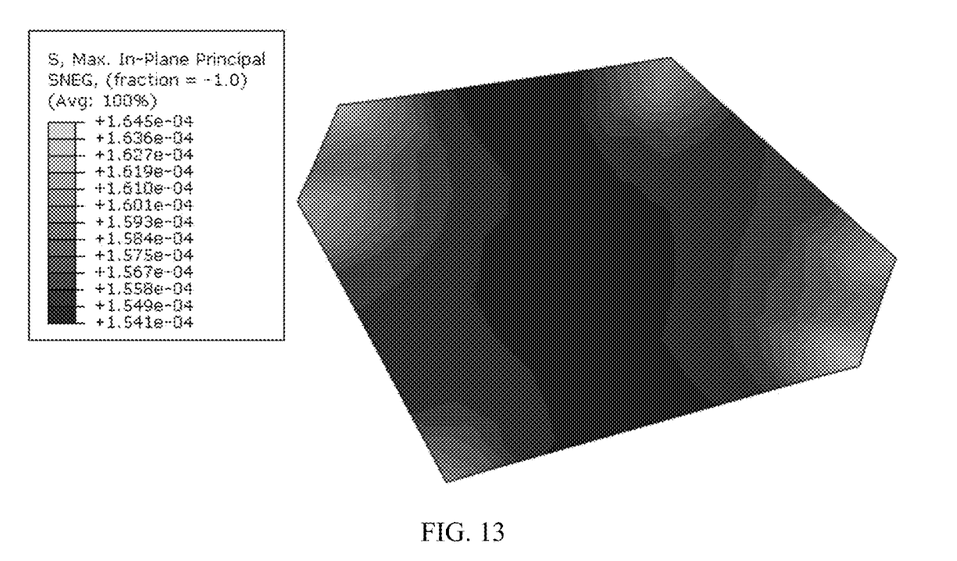
FIG. 13 is a first principal stress cloud chart (MPa) of a single endothelial cell in normal human cornea provided by an embodiment of the present disclosure.
Figure 14:
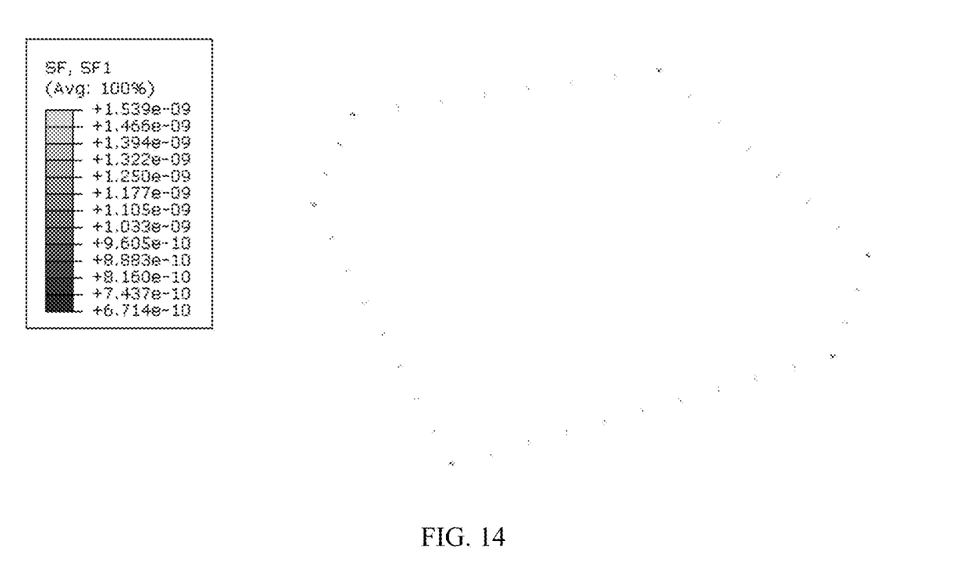
FIG. 14 is a schematic diagram of an example cell side beam element provided by an embodiment of the present disclosure.

In this embodiment, the model may be a normal human corneal endothelial cell model. A detailed geometric model of normal human corneal endothelial cells is imported into Hypermesh, the subsequent steps are carried out according to the steps in this solution, the model is as shown in FIG. 12, the calculation is submitted, and a result is viewed. Angles of cell vertices are different, and first principal stresses of the vertices are different (see FIG. 13). The angle and first principal stress of one of the vertices are extracted, and the results are 120.212° and 163.98 MPa. The sum of axial forces (F) of the beam elements on cell sides is extracted, and is divided by a side length (L) as a force per unit length on a cell side, reflecting the side length and force (see FIG. 14). A result is extracted, and F/L is calculated to be 7.14E-10 N/μm. The cell side length and the average stress on a side are extracted to reflect the difference in stresses on the cell side (see FIG. 13). The average value of the first principal stresses on one of the sides is extracted, and the result is 158.330 Pa.

Figure 15:
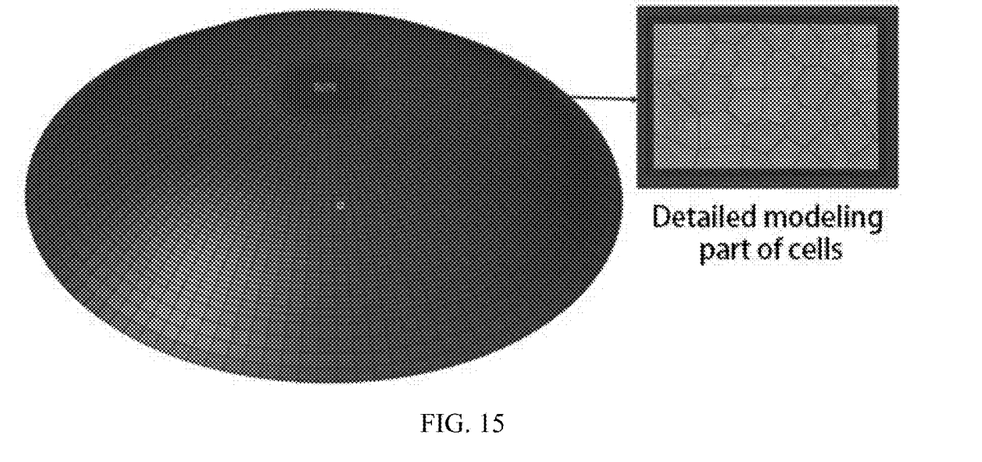
FIG. 15 is a schematic diagram of a corneal endothelial cell mesh model at decompensation stage after PKP provided by an embodiment of the present disclosure.
Figure 16:
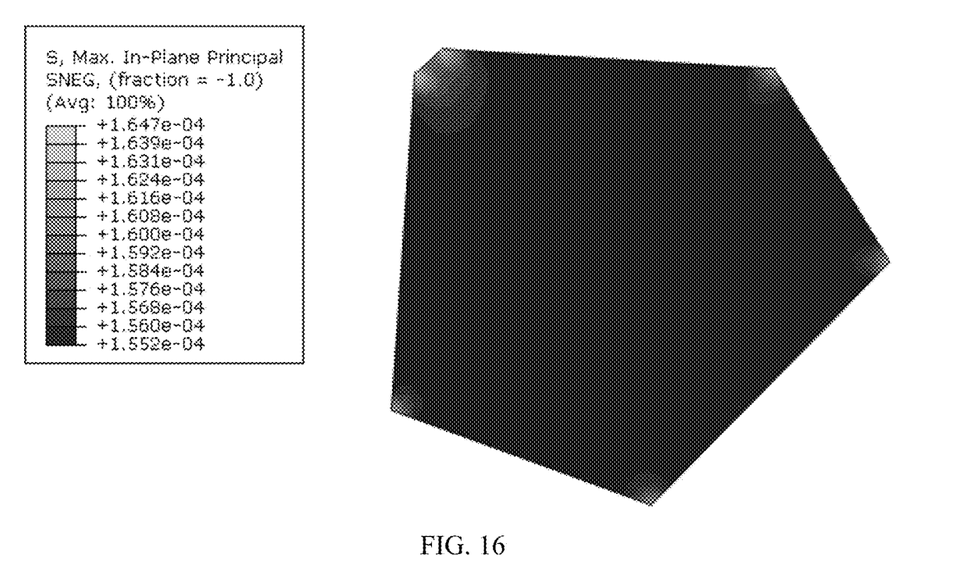
FIG. 16 is a first principal stress cloud chart (MPa) of a single endothelial cell in human cornea at decompensation stage after PKP provided by an embodiment of the present disclosure.
Figure 17:
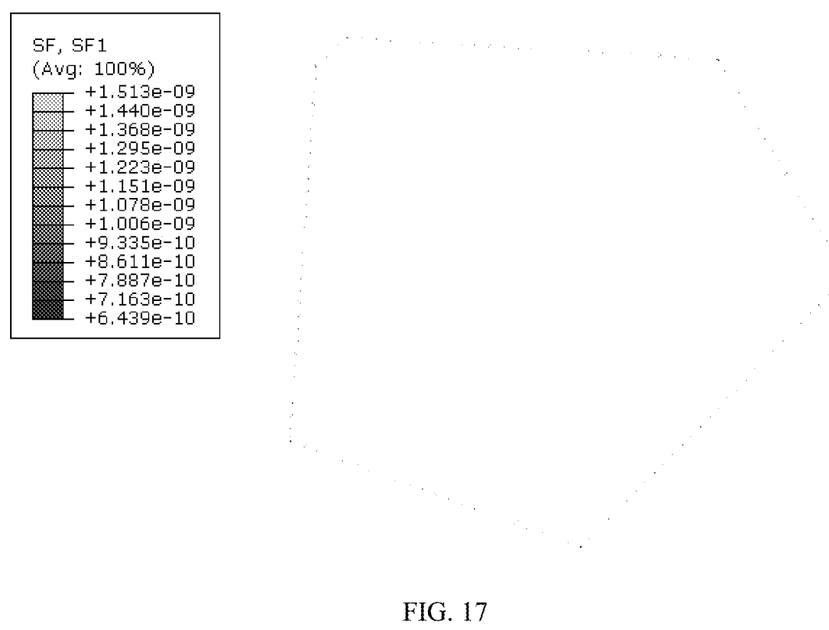
FIG. 17 is a schematic diagram of an example cell side beam element provided by an embodiment of the present disclosure.

In this embodiment, the model may also be a model of human corneal endothelial cells at decompensation stage after PKP. A detailed geometric model of human corneal endothelial cells at decompensation stage after PKP is imported into Hypermesh, the subsequent steps are carried out according to the steps in this solution, the model is shown in FIG. 15, the calculation is submitted, and a result is viewed. Angles of cell vertices are different, and first principal stresses of the vertices are different (see FIG. 16). The angle and first principal stress of one of the vertices are extracted, and the results are 131.624° and 164.40 MPa. The sum of axial forces (F) of the beam elements on cell sides is extracted, and is divided by a side length (L) as a force per unit length on a cell side, reflecting the side length and force (see FIG. 17). A result is extracted, and F/L is calculated to be 7.96E-10 N/μm. The cell side length and the average stress on a side are extracted to reflect the difference in stresses on the cell side (see FIG. 16). The average value of the first principal stresses on one of the sides is extracted, and the result is 162.289 Pa.

Each embodiment in this specification is described in a progressive manner. Each embodiment focuses on its differences from other embodiments. The same and similar parts between the various embodiments can be referred to each other.

Specific embodiments are used herein to illustrate the principles and implementation methods of the present disclosure. The description of the above embodiments is only used to help understand the method and its core idea of the present disclosure. At the same time, for those of ordinary skill in the art, there will be changes in the specific implementation and application scope according to the idea of the present disclosure. In summary, the content of this specification should not be construed as a limitation of the present disclosure.

What is claimed is:

1. A method for building a finite element model of corneal endothelial cells for diagnosing and treatment of corneal diseases, comprising:

importing a standard corneal model into finite element pre-processing software, and generating 2D meshes, to obtain a . . .

constraining the outermost nodes of the corneal endothelial cells to the translational degrees of freedom in the X, Y and Z directions to fix the complete corneal endothelial cell model;

selecting the corneal endothelial cell model, and applying a pressure of 2E-07 MPa, to simulate an intraocular pressure; and submitting the calculation in the finite element simulation software and obtaining a calculation result to provide reference indicators of cell functions; wherein the calculation result comprises difference in stresses on cell side based on side length and force.

2. The method for building a finite element model of corneal endothelial cells according to claim 1, wherein the generating 2D meshes comprises:

selecting a corneal endothelial surface to generate 2D meshes, the minimum mesh size being 2 μm, the maximum mesh size being 368 μm, the size of an intermediate mesh of the model as a basic mesh model being 2 μm that gradually increases in a radial direction;

using a transition mesh division method to keep all elements as quadrilateral elements; and deleting the intermediate mesh as a basic mesh, and leaving a 469 μm×324 μm space, to replace a detailed cell model.

3. The method for building a finite element model of corneal endothelial cells according to claim 1, wherein after importing the detailed geometric model of corneal endothelial cells, the method further comprises:

generating a 2D mesh according to the detailed geometric model, the size of the mesh being 2 μm.

* * * * *